(12) United States Patent
Liu

(10) Patent No.: US 11,791,804 B2
(45) Date of Patent: Oct. 17, 2023

(54) CIRCUIT FOR GENERATING BIAS SIGNAL AND CLOCK INPUT CIRCUIT

(71) Applicant: CHANGXIN MEMORY TECHNOLOGIES, INC., Hefei (CN)

(72) Inventor: Zhonglai Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/869,796

(22) Filed: Jul. 21, 2022

(65) Prior Publication Data

US 2023/0291392 A1    Sep. 14, 2023

Related U.S. Application Data

(63) Continuation of application No. PCT/CN2022/091771, filed on May 9, 2022.

(30) Foreign Application Priority Data

Mar. 11, 2022  (CN) .......................... 202210237656.X

(51) Int. Cl.
*H03K 3/012* (2006.01)
*H03K 17/56* (2006.01)

(52) U.S. Cl.
CPC ............. *H03K 3/012* (2013.01); *H03K 17/56* (2013.01)

(58) Field of Classification Search
CPC ................................ H03K 3/012; H03K 17/56
See application file for complete search history.

(56) References Cited

U.S. PATENT DOCUMENTS

| | | | |
|---|---|---|---|
| 6,356,488 B1 * | 3/2002 | Kang | G11C 16/30 365/185.23 |
| 10,725,122 B2 * | 7/2020 | Rubinsztain | G08B 21/185 |
| 2005/0237105 A1 | 10/2005 | Park | |
| 2008/0231372 A1 * | 9/2008 | Chen | H03F 1/0211 330/296 |
| 2012/0007680 A1 * | 1/2012 | Hijikata | H03F 1/3205 330/278 |
| 2020/0177022 A1 * | 6/2020 | Goto | H02J 9/062 |

FOREIGN PATENT DOCUMENTS

| | | |
|---|---|---|
| CN | 105404351 B | 9/2017 |
| CN | 107179797 B | 8/2018 |

* cited by examiner

*Primary Examiner* — Sibin Chen
(74) *Attorney, Agent, or Firm* — KILPATRICK TOWNSEND & STOCKTON LLP

(57) ABSTRACT

Provided are a circuit for generating a bias signal and a clock input circuit for applying the circuit for generating a bias signal. The circuit for generating a bias signal includes: a first subcircuit, a first terminal of the first subcircuit being connected to a power supply voltage by means of a first node, a second terminal of the first subcircuit being connected to a current stabilization circuit by means of a second node, the first subcircuit being configured to generate a bias signal and output the bias signal by means of the second node, and the current stabilization circuit being configured to provide a constant current to the second node; and a second subcircuit, two terminals of the second subcircuit being respectively connected to the first node and the second node, the second subcircuit including a first resistor element and a first switch element connected in series.

14 Claims, 7 Drawing Sheets

CIRCUIT FOR GENERATING BIAS SIGNAL AND CLOCK INPUT CIRCUIT

CROSS-REFERENCE TO RELATED APPLICATION

The present disclosure is a continuation of PCT/CN2022/091771, filed on May 9, 2022, which claims priority to Chinese Patent Application No. 202210237656.X titled "CIRCUIT FOR GENERATING BIAS SIGNAL AND CLOCK INPUT CIRCUIT" and filed on Mar. 11, 2022, the entire contents of which are incorporated herein by reference.

TECHNICAL FIELD

The present disclosure relates to the field of electronic circuit technology, and more particularly, to a circuit for generating a bias signal capable of flexibly adjusting a bias voltage, and a clock input circuit for applying the circuit for generating a bias signal to control power.

BACKGROUND

In a memory, a clock circuit is configured to control signal timing and has a wide range of applications.

The clock circuit typically includes a clock generation circuit, a clock calibration circuit and other related auxiliary circuits to maintain accuracy of input clock. In related technologies, the clock circuit generally maintains stability and has fixed power consumption. In an overall context of optimizing the power consumption of integrated circuits, to maintain stability of clock, generally it is not considered to optimize the power consumption from a perspective of the clock circuit.

It is to be noted that the information disclosed in the above background art section is only for enhancement of understanding of the background of the present disclosure, and therefore may contain information that does not constitute the prior art that is already known to a person of ordinary skill in the art.

SUMMARY

An objective of the present disclosure is to provide a circuit for generating a bias signal capable of flexibly adjusting a bias voltage, and a clock input circuit for applying the circuit for generating a bias signal to control power.

According to a first aspect of the present disclosure, there is provided a circuit for generating a bias signal, including: a first subcircuit and a second subcircuit. A first terminal of the first subcircuit is connected to a power supply voltage by means of a first node, a second terminal of the first subcircuit is connected to a current stabilization circuit by means of a second node, the first subcircuit is configured to generate a bias signal and output the bias signal by means of the second node, and the current stabilization circuit is configured to provide a constant current to the second node. Two terminals of the second subcircuit are respectively connected to the first node and the second node, and the second subcircuit includes a first resistor element and a first switch element connected in series, where the first switch element is controlled to be turned on or off by a low-speed mode control signal. The low-speed mode control signal is configured for controlling the first switch element to be turned on to control the second subcircuit to be connected in parallel with the first subcircuit, to raise a bias voltage of the bias signal of the second node.

According to a second aspect of the present disclosure, there is provided a clock input circuit, which includes a clock calibration circuit and the circuit for generating a bias signal. A first input terminal of the clock calibration circuit is connected to an external input clock, a second input terminal of the clock calibration circuit is connected to a reference clock, the clock calibration circuit is configured to calibrate the external input clock and output a differential clock signal, and the clock calibration circuit is connected to a power supply voltage by means of a third switch element. The circuit for generating a bias signal is connected to a control terminal of the third switch element, and the circuit for generating a bias signal is configured to generate a bias signal, and control degree of opening of the third switch element by means of the bias signal.

It is to be understood that the above general description and the detailed description below are merely exemplary and explanatory, and do not limit the present disclosure.

BRIEF DESCRIPTION OF THE DRAWINGS

The accompanying drawings herein are incorporated in and constitute a part of this specification, illustrate embodiments conforming to the present disclosure and, together with the specification, serve to explain the principles of the present disclosure. Apparently, the accompanying drawings in the following description show merely some embodiments of the present disclosure, and persons of ordinary skill in the art may still derive other drawings from these accompanying drawings without creative efforts.

DETAILED DESCRIPTION

Figure 1:
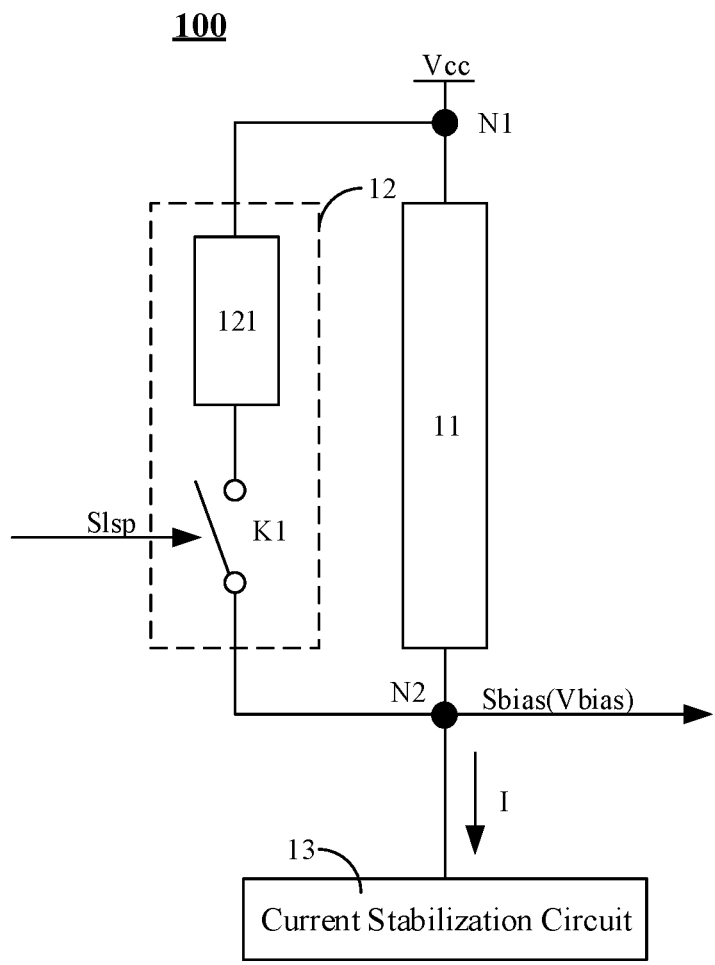
FIG. 1 is a schematic structural diagram of a circuit for generating a bias signal according to an exemplary embodiment of the present disclosure.

Exemplary embodiments will now be described more comprehensively with reference to the accompanying drawings. However, the exemplary embodiments can be embodied in many forms and should not be construed as being limited to the embodiments set forth herein; rather, these embodiments are provided such that the present disclosure will be made thorough and complete, and the concept of exemplary embodiments will be fully conveyed to those skilled in the art. Furthermore, the described features, structures, or characteristics may be combined in any suitable manner in one or more embodiments. In the following description, numerous details are provided to provide a thorough understanding of the embodiments of the present disclosure. Those skilled in the art will recognize, however, that the technical solution of the present disclosure may be practiced without one or more of the details described, or that other methods, components, devices, steps and so on may be employed. In other instances, well-known technical solutions are not shown or described in detail to avoid obscuring aspects of the present disclosure.

Furthermore, the accompanying drawings are merely schematic illustrations of the present disclosure. Same or similar parts are denoted by same reference numbers in the drawings and, thus, a detailed description thereof will be omitted. Some block diagrams shown in the figures are functional entities and not necessarily to be corresponding to a physically or logically individual entities. These functional entities may be implemented in software form, or implemented in one or more hardware circuits or integrated circuits, or implemented in different networks and/or processor apparatuses and/or microcontroller apparatuses.

A detailed description of the exemplary embodiments of the present disclosure will be made in the following with reference to the accompanying drawings.

FIG. 1 is a schematic structural diagram of a circuit for generating a bias signal according to an exemplary embodiment of the present disclosure.

Referring to FIG. 1, the circuit 100 for generating a bias signal may include:

a first subcircuit 11, where a first terminal of the first subcircuit 11 is connected to a power supply voltage Vcc by means of a first node N1, a second terminal of the first subcircuit 11 is connected to a current stabilization circuit 13 by means of a second node N2, the first subcircuit 11 is configured to generate a bias signal Sbias and output the bias signal Sbias by means of the second node N2, and the current stabilization circuit 13 is configured to provide a constant current I to the second node N2; and a second subcircuit 12, where two terminals of the second subcircuit 12 are respectively connected to the first node N1 and the second node N2, the second subcircuit 12 includes a first resistor element 121 and a first switch element K1 connected in series, and the first switch element K1 is controlled to be turned on or off by a low-speed mode control signal Slsp.

The low-speed mode control signal Slsp is configured for controlling the first switch element K1 to be turned on to control the second subcircuit 12 to be connected in parallel with the first subcircuit 11, to raise a bias voltage Vbias of the bias signal Sbias of the second node N2.

In the embodiment as shown in FIG. 1, assuming that a resistance of the first subcircuit is R0. Because a current of the second node N2 is set to the constant current I by the current stabilization circuit 13, a voltage (i.e., the bias voltage Vbias) of the second node N2 is determined based on Formula (1):

$$\text{Vbias} = Vcc - I * R0 \tag{1}$$

When the first switch element K1 is turned on, the first resistor element 121 in the second subcircuit is connected in parallel with the first subcircuit 11, resulting in a decrease in resistance between the second node N2 and the power supply voltage Vcc. Assuming that the resistance of the resistor element 121 is R1, the bias voltage Vbias at this moment is determined based on Formula (2):

$$Vbias = Vcc - I * \frac{R0 * R1}{R0 + R1} \tag{2}$$

As can be seen, after the first switch element K1 is turned on, the bias voltage Vbias rises.

A rising value of the bias voltage Vbias may be determined by controlling a resistance value of the first resistor element 121. In some embodiments, a plurality of second subcircuits connected in parallel may be provided, where each of the plurality of second subcircuits is provided with a switch element to control entry to a parallel state, and each of the plurality of second subcircuits has different resistance values, such that branches with different resistance values may be controlled to be connected in parallel between the first node N1 and the second node N2, to control the bias voltage Vbias to rise to different voltage values.

Figure 2:
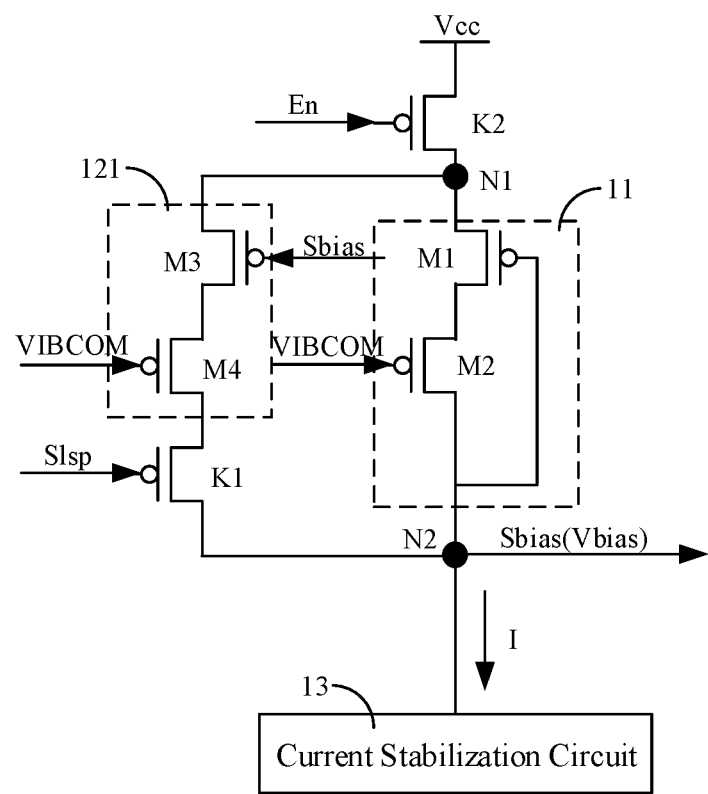
FIG. 2 is a schematic diagram showing a first subcircuit and a second subcircuit according to an embodiment of the present disclosure.

FIG. 2 is a schematic diagram showing a first subcircuit and a second subcircuit according to an embodiment of the present disclosure.

Referring to FIG. 2, in one embodiment, the first subcircuit 11 may include a first transistor M1 and a second transistor M2, where both the first transistor M1 and the second transistor M2 are transistors of the same type. A first terminal of the first transistor M1 is connected to the first node N1, a second terminal of the first transistor M2 is connected to a first terminal of the second transistor M2, a control terminal of the first transistor M1 and a second terminal of the second transistor M2 are both connected to the second node N2, and a control terminal of the second transistor M2 is connected to a bias control voltage VIBCOM.

The first resistor element 121 in the second subcircuit 12 may include a third transistor M3 and a fourth transistor M4, where both the third transistor M3 and the fourth transistor M4 are transistors of the same type. A first terminal of the third transistor M3 is connected to the first node N1, a second terminal of the third transistor M3 is connected to a first terminal of the fourth transistor M4, and a control terminal of the third transistor M3 is connected to the second node N2. A second terminal of the fourth transistor M4 is connected to the second node N2 by means of the first switch element K1, and a control terminal of the fourth transistor M4 is connected to the bias control voltage VIBCOM.

In the embodiment as shown in FIG. 2, the first transistor M1, the second transistor M2, the third transistor M3 and the fourth transistor M4 are all P-type transistors, and more particularly, channel-enhanced P-type transistors. When the first transistor M1, the second transistor M2, the third transistor M3 and the fourth transistor M4 are all channel-enhanced P-type transistors, a source of the first transistor M1 is connected to the first node N1, a drain of the first transistor M1 is connected to a source of the second transistor M2, a gate of the first transistor M1 and a drain of the second transistor M2 are both connected to the second node N2, and a gate of the second transistor M2 is connected to the bias control voltage VIBCOM. A source of the third transistor M3 is connected to the first node N1, a drain of the third transistor M3 is connected to a source of the fourth transistor M4, a gate of the third transistor M3 and a drain of the fourth transistor M4 are both connected to the second node N2, and a gate of the four transistors M4 is connected to the bias control voltage VIBCOM.

In the embodiment as shown in FIG. 2, the first transistor M1 is controlled to be turned on by the bias voltage Vbias of the second node N2, and has a first resistance. The gate of the second transistor M2 is controlled by the bias control voltage VIBCOM and has a second resistance. Sum of the first resistance and the second resistance constitutes the resistance R0 of the first subcircuit.

In one embodiment, the third transistor M3 and the first transistor M1 have an equal conductive channel width-to-length ratio, and the fourth transistor M4 and the second transistor M2 have an equal conductive channel width-to-length ratio. A channel length of the first transistor M1 may be the same as or may be different from that of the second transistor M2. That is, the resistance of the first resistor element 121 is equal to the resistance R0 of the first subcircuit 11. After the first switch element K1 is turned on, the resistance between the power supply voltage Vcc and the second node N2 may be R0/2.

In this embodiment, the first transistor M1 and the second transistor M2 have the same channel length.

In this embodiment, the third transistor M3 and the fourth transistor M4 in the second subcircuit 12 may be fabricated in the same active area with the first transistor M1 and the second transistor M2 in the first subcircuit 11, to reduce area occupied by the branches. In this way, only by increasing the area of one first switch subcircuit K1, the bias voltage Vbias may be set to be adjustable. By using the first transistor M1 and the second transistor M2 as a first resistor and using the third transistor M3 and the fourth transistor M4 as a second resistor, the circuit may have stable performance and good reliability, making it easy to stably adjust the current flowing through the first subcircuit 11.

In one embodiment, the first switch element K1 is also a channel-enhanced P-type transistor, and a ratio of the conductive channel width-to-length ratio of the first switch element K1 to the conductive channel width-to-length ratio of the fourth transistor M4 may be 1 to 3 for example, to ensure that the channel length of the first switch element K1 is greater than that of the fourth transistor M4 and of the third transistor M3, and to ensure that a flowable current is much greater than the current flowing through the second subcircuit 12 when the first switch element K1 is turned on, thereby preventing the first switch element K1 from becoming a bottleneck of the current flowing through the second subcircuit 12. In this embodiment, the channel length selected for the first switch element K1 is twice the channel length of the fourth transistor M4.

The second subcircuit 12 may also be implemented by one or more resistors and/or one or more other equivalent resistor elements that can achieve the same resistance, which is not particularly limited in the present disclosure.

Figure 3:
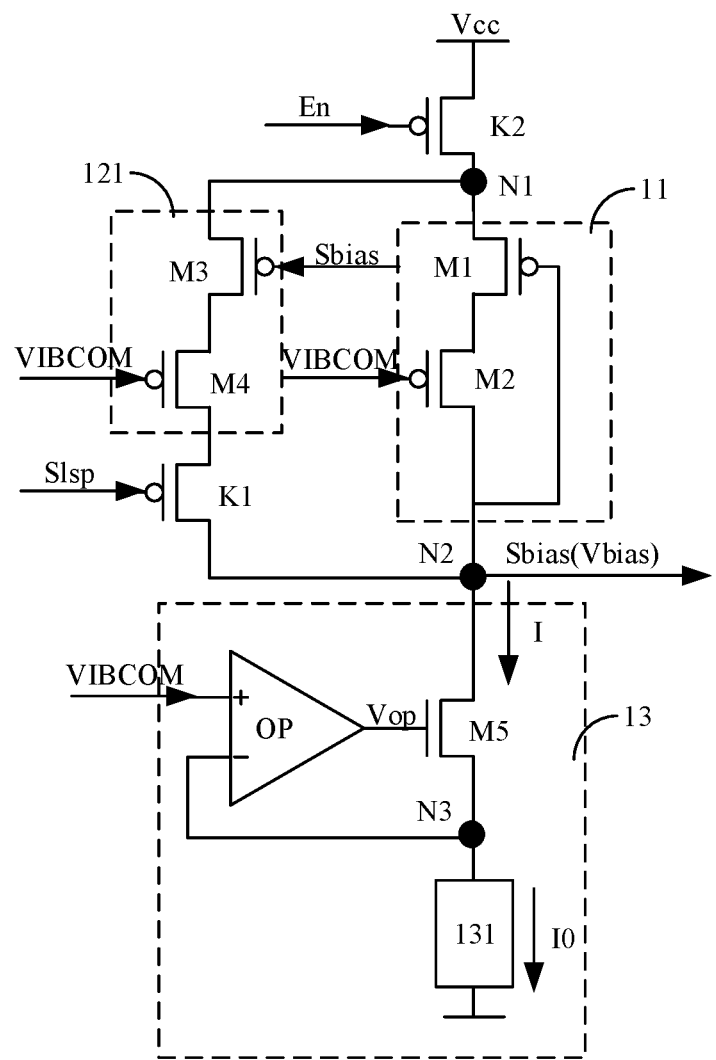
FIG. 3 is a schematic circuit diagram of a current stabilization circuit according to an embodiment of the present disclosure.

FIG. 3 is a schematic circuit diagram of a current stabilization circuit according to an embodiment of the present disclosure.

Referring to FIG. 3, in one embodiment, the current stabilization circuit 13 that provides the constant current I to the second node N2 may be implemented by an N-type transistor operating in a saturation region. That is, the current stabilization circuit 13 may include a fifth transistor M5 and a second resistor element 131, where the fifth transistor M5 operates in the saturation region. A first terminal of the fifth transistor M5 is connected to the second node N2, and a second terminal of the fifth transistor M5 is connected to the third node N3. Two terminals of the second resistor element 131 are connected to the third node N3 and grounded, respectively.

When the N-type fifth transistor M5 operates in the saturation region, its drain (i.e., the second node N2) has the constant current I. To control the fifth transistor M5 to operate in the saturation region, a gate control voltage greater than a transistor threshold needs to be provided.

In the embodiment as shown in FIG. 3, a gate of the fifth transistor M5 is connected to an output terminal of an amplifier OP, a first input terminal of the amplifier OP is connected to the bias control voltage VIBCOM, and a second input terminal of the amplifier OP is connected to the third node N3. The first input terminal of the amplifier OP may be a non-inverting input terminal or an inverting input terminal, and correspondingly, the second input terminal of the amplifier OP is an inverting input terminal or a non-inverting input terminal.

In this embodiment, the first input terminal of the amplifier OP is the non-inverting input terminal, and the second input terminal of the amplifier OP is the inverting input terminal.

Due to virtual short characteristic of the amplifier OP, a voltage across the third node N3 is identically equal to the bias control voltage VIBCOM. Assuming that the second resistor element 131 has a resistance R2, a current I0 of the third node N3 may be determined based on Formula (3):

$$I0 = \frac{VIBCOM}{R2} \quad (3)$$

In this case, a saturation current (i.e., the current I of the second node N2) flowing through the fifth transistor M5 is equal to the current I0 of the third node N3.

For the fifth transistor M5 operating in the saturation region, when its fabrication process and device size are constant, magnitude of the saturation current I is only related to a gate voltage applied on the fifth transistor M5. In this embodiment, the gate voltage applied on the fifth transistor M5 is an output voltage Vop of the amplifier OP. When an input terminal voltage (i.e., the bias control voltage VIBCOM) of the amplifier OP remains unchanged, the gate voltage Vop of the fifth transistor M5 remains unchanged, and a conduction state of the fifth transistor M5 in the saturation region remains unchanged, and the saturation current remains unchanged, that is, the current I of the second node N2 remains constant.

The second resistor element 131 may be implemented in various ways, for example, including one or more variable resistors, fixed resistors and/or one or more elements (e.g., a transistor whose degree of opening is controlled by a gate voltage, etc.) equivalent to the resistor, which is not particularly limited in the present disclosure.

Figure 4:
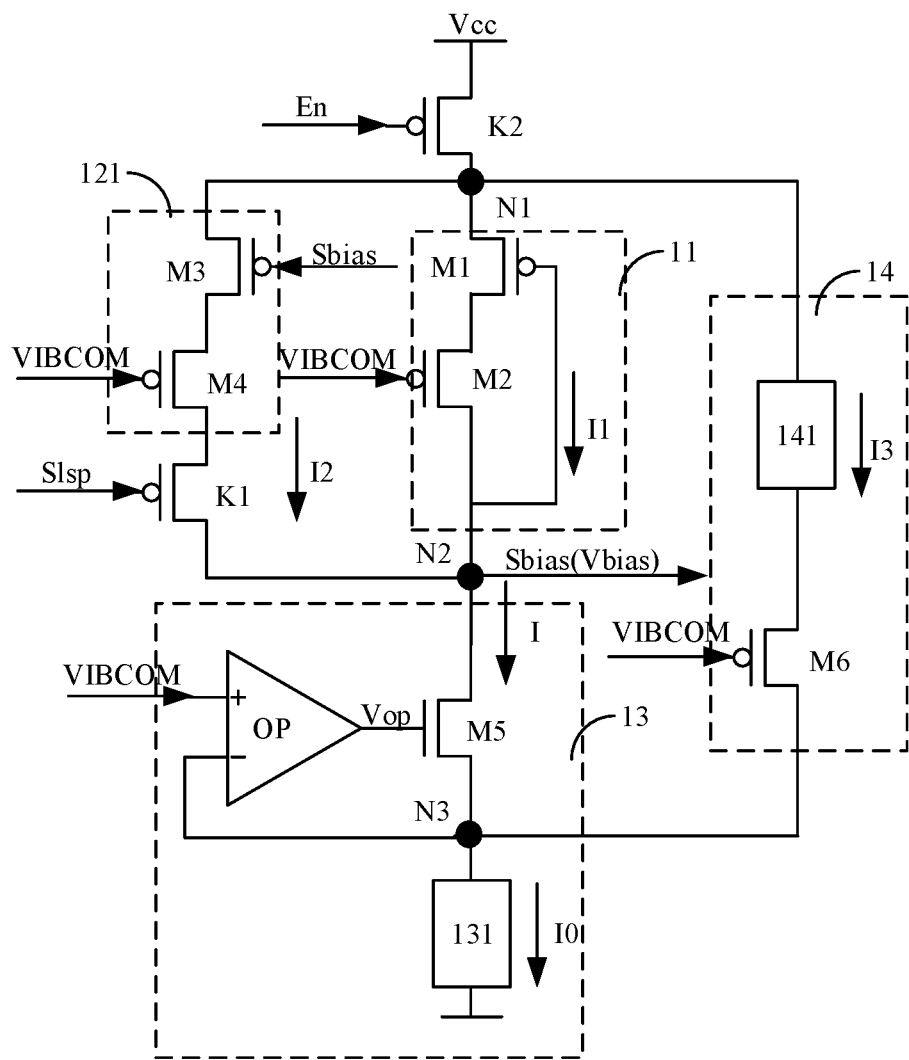
FIG. 4 is a schematic circuit diagram of a circuit for generating a bias signal according to an embodiment of the present disclosure.

FIG. 4 is a schematic circuit diagram of a circuit for generating a bias signal according to an embodiment of the present disclosure.

Referring to FIG. 4, in one embodiment, the circuit for generating a bias signal further includes a third subcircuit 14 configured to reduce the current of the second node N2. Assuming that the third subcircuit 14 has a resistance R3, a current I3 flowing through the third subcircuit 14 is a ratio of a voltage difference between the voltage Vcc across the first node N1 and the voltage VIBCOM across the third node N3 to the resistance R3, namely:

$$I3 = \frac{Vcc - VIBCOM}{R3} \quad (4)$$

At this moment, the current I0 (equal to VIBCOM/R2) flowing through the second resistor element 131 remains unchanged, and the current I0 of the third node N3 is equal to sum of a current I1 of the first subcircuit 11, a current I2 of the second subcircuit 12 and the current I3 flowing through the third subcircuit 14, namely:

$$I0=I1+I2+I3 \quad (5)$$

In the embodiment as shown in FIG. 4, when the first switch element K1 is turned on and VIBCOM controls the fourth transistor M4 to be enabled and a sixth transistor M6 to be enabled or partially enabled, the constant current of the second node N2 is I=I1+I2=I0−I3, and the constant current of the second node N2 is smaller than I0 in the embodiment as shown in FIG. 3. At this moment, because equivalent resistances of the first subcircuit 11 and the second subcircuit 12 decrease compared to when the first switch element K1 is turned off, the constant current I of the second node N2 decreases. According to Formula (2), the bias voltage Vbias further rises.

By adjusting the resistance value of the third subcircuit 14, the current of the second node N2 may be reduced to an appropriate value when the power supply voltage Vcc is higher, the first subcircuit 11 accepts limited current, and other elements of the circuit are unadjustable due to limitations of conditions, etc.

Referring to FIG. 4, in one embodiment, the third subcircuit 14 may include a third resistor element 141 and the sixth transistor M6, where a first terminal of the sixth transistor M6 is connected to the third resistor element 141, a second terminal of the sixth transistor M6 is connected to the third node N3, and a gate of the sixth transistor M6 is connected to the bias control voltage VIBCOM. The sixth transistor M6 is, for example, a P-type transistor of the same type as the second transistor M2 and the fourth transistor M4. The sixth transistor M6 is controlled by the bias control voltage VIBCOM, and thus has a certain resistance.

The third subcircuit 14 can reduce the current of the second node N2 while keeping the bias voltage Vbias within a certain range, thereby reducing a drive current of the load circuit. In this way, it is ensured that in a high-speed mode, a current of a circuit at a subsequent stage not only can maintain a high-frequency operation, but also can avoid excessive power consumption.

In the embodiments as shown in FIGS. 2 to 4, the first node N1 may be connected to the power supply voltage Vcc by means of the second switch element K2, and the second switch element K2 is controlled by a bias voltage enable control signal En to be turned on or off, to turn on or off the circuit 100 for generating a bias signal.

The P-type transistor has better high-voltage resistance and can operate stably under the power supply voltage Vcc with a greater voltage value, thus both the first switch element K1 and the second switch element K2 may be P-type transistors.

Figure 5:
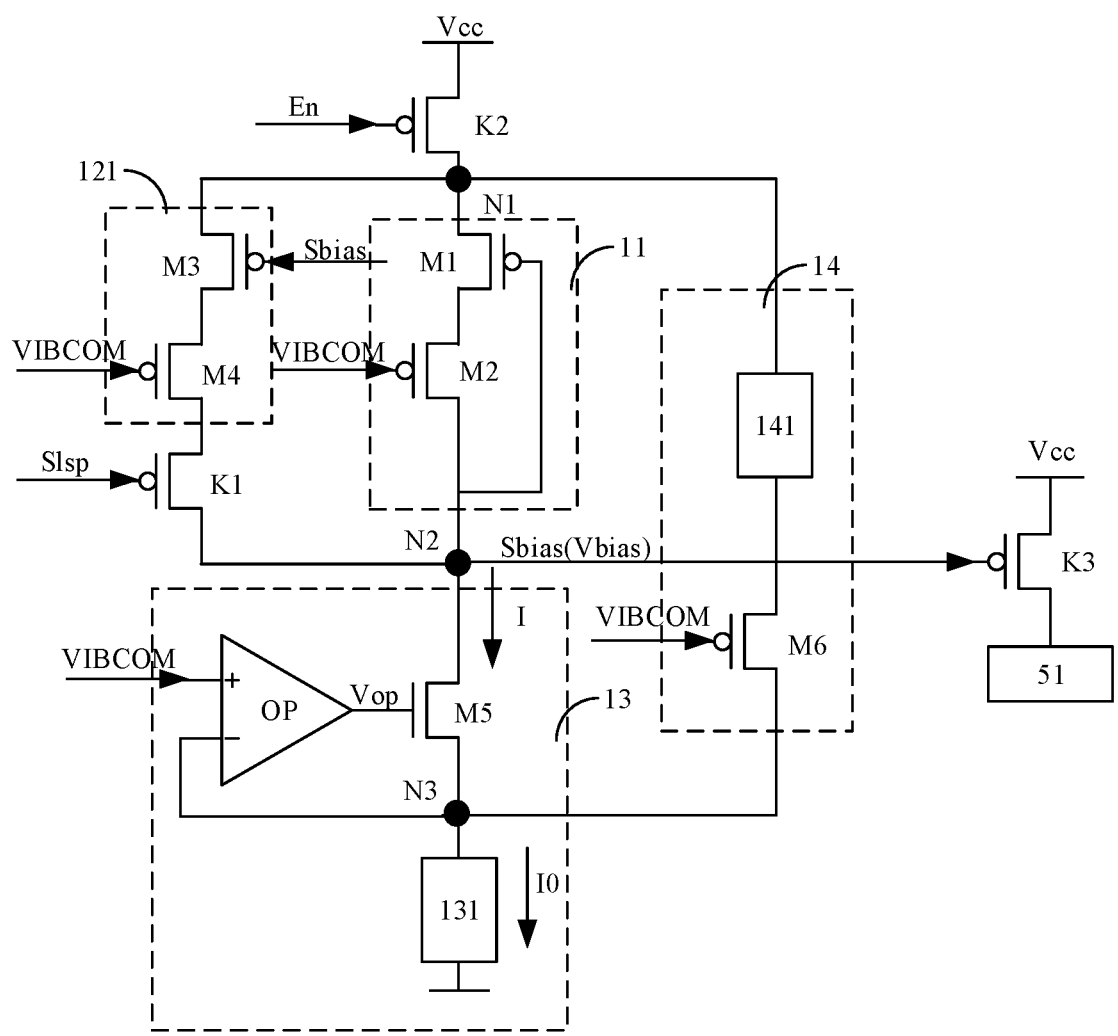
FIG. 5 is a schematic diagram of a load circuit controlled by the circuit for generating a bias signal according to an embodiment of the present disclosure.

FIG. 5 is a schematic diagram of a load circuit controlled by the circuit for generating a bias signal according to an embodiment of the present disclosure.

Referring to FIG. 5, in one embodiment, the bias signal Sbias may be configured for controlling the third switch element K3, which is a P-type transistor. A first terminal of the third switch element K3 is electrically connected to the power supply voltage Vcc, a second terminal of the third switch element K3 is connected to the load circuit 51, and a control terminal of the third switch element K3 is connected to the second node N2.

A manner of controlling the load circuit by the bias signal Sbias may also be achieved by using the first subcircuit 11 as a current generating subcircuit of a current mirror in addition to driving the third switch element K3 in the load circuit by the voltage across the second node N2. By providing another current generating subcircuit in the current mirror to mirror the constant current I flowing through the first subcircuit 11, the current flowing through the first subcircuit 11 may be mirrored as the drive current of the load circuit. When the first switch element K1 is turned on, the current flowing through the first subcircuit 11 decreases (is shunted by the second subcircuit 12), and thus the drive current of the load circuit decreases, which may also reduce the power of the load circuit.

The load circuit may be, for example, a clock calibration circuit. That is, the circuit for generating a bias signal may be applied to reduce the power of the clock calibration circuit.

In the study of the present disclosure, it is found that in related technologies, to maintain clock stability, changes of the clock circuit generally are not considered when considering power reduction of the integrated circuits. The clock circuit is widely used in the integrated circuits, thus reducing the power of the clock circuit is of great significance to reducing the overall power of the integrated circuits/chips.

It is found that in the memory, the bias voltage (configured for controlling power of a clock input circuit) generated in an existing word clock (WCK) input buffer bias generation circuit (referred to as the clock input circuit) is constant. That is, the power of the clock input circuit is fixed, which cannot be applicable to scenarios with different power requirements. In the low-speed mode, the clock circuit does not need to maintain a high power, and thus the power of the clock circuit has room for reduction.

The circuit 100 for generating a bias signal provided by the embodiment of the present disclosure is applied to the clock circuit, when the clock calibration circuit operates in the low-speed mode, it has lower requirements for power. In this case, the first switch element K1 may be controlled to be turned on by means of the low-speed mode control signal Slsp, such that the bias voltage Vbias across the second node N2 rises, the degree of opening of the P-type third switch element K3 decreases, and the current flowing through the third switch element K3 decreases, thereby effectively reducing the power of the load circuit 51. When the current I1 of the first subcircuit 11 is mirrored as the drive current of the load circuit by means of the current mirror, the first switch element K1 may be controlled to be turned on by means of the low-speed mode control signal Slsp, such that the current I1 of the first subcircuit 11 is reduced, further, the drive current of the load circuit is reduced, and thus the power of the load circuit is reduced.

When the clock calibration circuit operates in the high-speed mode, it has a higher requirement for power. In this case, the first switch element K1 may be controlled to be turned off, and the bias voltage Vbias across the second node N2 is reduced, such that the third switch element K3 is maintained to be driven at a lower high-speed voltage, to provide a high power to the load circuit 51.

Figure 6:
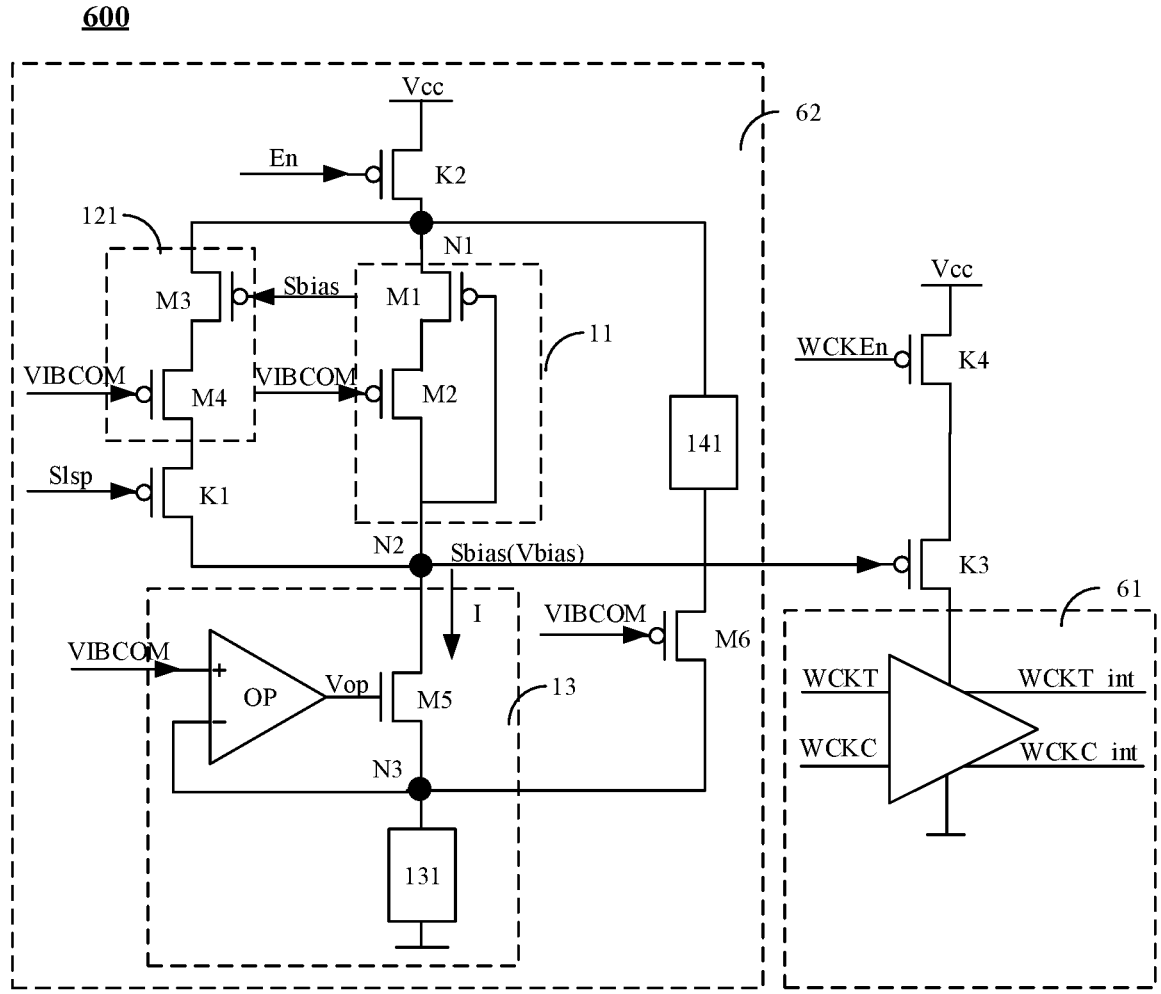
FIG. 6 is a schematic diagram of a clock input circuit according to an embodiment of the present disclosure.

FIG. 6 is a schematic diagram of a clock input circuit according to an embodiment of the present disclosure.

Referring to FIG. 6, in one embodiment, the clock input circuit 600 may include:

a clock calibration circuit 61, where a first input terminal of the clock calibration circuit 61 is connected to an external input clock WCKT, a second input terminal of the clock calibration circuit 61 is connected to a reference clock WCKC, the clock calibration circuit 61 is configured to calibrate the external input clock WCKT and output differential clock signals WCKT_int and WCKC_int, and the clock calibration circuit 61 is connected to a power supply voltage Vcc by means of a third switch element K3; and a circuit 62 for generating a bias signal, where the circuit 62 for generating a bias signal is connected to a control terminal of the third switch element K3, the circuit 62 for generating a bias signal is configured to generate a bias signal Sbias, and control degree of opening of the third switch element K3 by means of the bias signal Sbias.

The circuit 62 for generating a bias signal may include the embodiment as shown in any one of FIGS. 1 to 5. The third switch element K3 is a P-type transistor, and the circuit 100 for generating a bias signal is configured to raise a bias voltage Vbias of the bias signal Sbias in response to a low-speed mode control signal Slsp, to reduce the power of the clock calibration circuit 61.

The third switch element K3 provides an operating power supply to the clock calibration circuit 61.

When the low-speed mode control signal Slsp controls the first switch element K1 to be turned on and the bias voltage Vbias rises, the degree of opening of the third switch element K3 decreases, an internal resistance increases, and a voltage division increases, causing a drain voltage across the third switch element K3 to drop and a current flowing through the third switch element K3 to drop. That is, the drive voltage across the clock calibration circuit 61 drops and the drive current flowing through the clock calibration circuit 61 drops, such that the power of the clock calibration circuit 61 decreases.

When an output current of the third switch element K3, which is mirrored from the current of the first subcircuit 11 by means of the current mirror, is used as the drive current of the clock calibration circuit 61, if the low-speed mode control signal Slsp controls the first switch element K1 to be turned on, the current I1 of the first subcircuit 11 decreases, and the drive current of the clock calibration circuit 61 decreases, which also causes the power of the clock calibration circuit 61 to decrease.

Therefore, the low-speed mode control signal Slsp may control power reduction of the clock calibration circuit 61 by controlling the first switch element K to be turned on.

In the embodiment as shown in FIG. 6, the third switch element K3 may be connected to the power supply voltage Vcc by means of a fourth switch element K4, where the fourth switch element K4 is controlled by a clock calibration enable signal WCKEn to control to enable or disable the clock input circuit 600 to calibrate the clock. The clock calibration circuit 61 in FIG. 6 is only for a simplified illustration, which does not limit a detailed circuit diagram of the clock calibration circuit.

The third switch element K3 may be a P-type transistor or an N-type transistor. Considering that the third switch element K3 is directly connected to a high power supply voltage, a P-type transistor may be used here. More particularly, both the third switch element K3 and the fourth switch element K4 are channel-enhanced P-type transistors.

With reference to the embodiment of FIG. 6, the first switch element K1 is controlled by the low-speed mode control signal Slsp, which may be outputted according to determination of frequency of the input clock WCKT.

Figure 7:
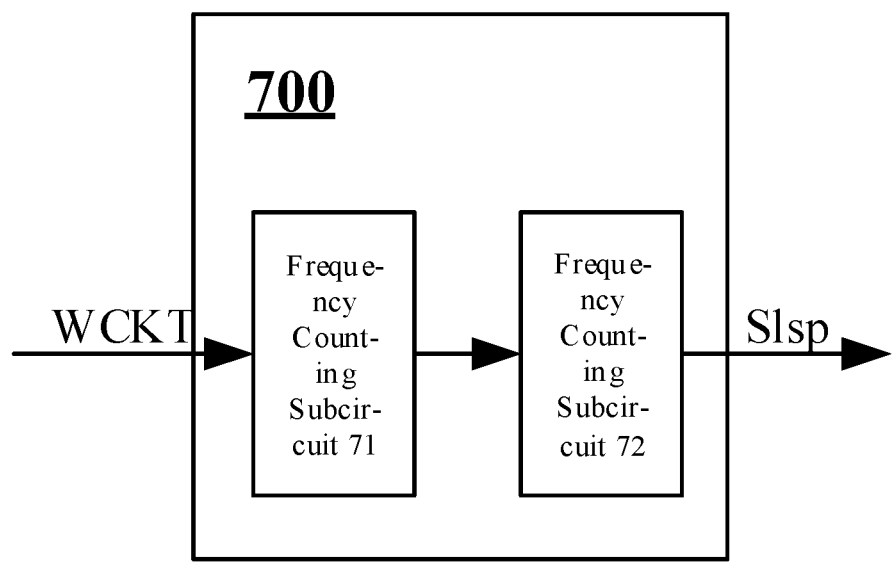
FIG. 7 is a block diagram of a circuit for generating a low-speed mode control signal according to an embodiment of the present disclosure.

FIG. 7 is a block diagram of a circuit for generating a low-speed mode control signal according to an embodiment of the present disclosure.

Referring to FIG. 7, in one embodiment, a circuit 700 for generating the low-speed mode control signal Slsp may include a frequency counting subcircuit 71 and a frequency comparison subcircuit 72.

An input terminal of the frequency counting subcircuit 71 is configured to receive the input clock WCKT, to perform frequency sampling on the input clock WCKT input in unit time. A sampling manner may include, for example, collecting rising edges and falling edges of the clock, and counting the rising edges and the falling edges to obtain number of input clocks WCKT in unit time, thereby obtaining a sampling clock frequency. The frequency counting subcircuit 71 may be implemented by means of a counter to detect the frequency of the input clock WCKT in real time.

Connected to the frequency counting subcircuit 71, the frequency comparison subcircuit 72 is configured to compare the sampling clock frequency measured by the frequency counting subcircuit 71 with a preset reference frequency, and output the low-speed mode control signal Slsp when a numerical value of the sampling clock frequency in unit time is less than that of the reference frequency. However, when the numerical value of the sampling clock frequency in unit time is greater than or equal to that of the reference frequency, the frequency comparison subcircuit 72 does not output any signal.

In one embodiment, an input terminal of the circuit 700 for generating the low-speed mode control signal Slsp may be connected to an output terminal of the clock calibration circuit 61 in the embodiment as shown in FIG. 6, and an output terminal of the circuit 700 for generating the low-speed mode control signal Slsp may be connected to the circuit 62 for generating a bias signal in the embodiment as shown in FIG. 6, to output the low-speed mode control signal Slsp when determining that the frequency of the input clock WCKT is less than the reference frequency, such that the first switch element K1 is controlled to be turned on, the bias voltage Vbias across the second node N2 increases, the degree of opening of the third switch element K3 decreases, and the drive voltage and the drive current are reduced for the clock calibration circuit 61, and thus the power of the clock calibration circuit 61 is reduced. When the current I1 of the first subcircuit 11 is mirrored as the drive current of the clock calibration circuit 61 and the first switch element K1 is turned on, the second subcircuit 12 that is turned on may shunt the current of the first subcircuit 11, such that the current I1 of the first subcircuit 11 decreases. In this way, the drive current of the clock calibration circuit 61 decreases, and thus the power of the clock calibration circuit 61 is reduced.

By reducing the power of the clock calibration circuit in the low-speed mode, the overall power of the clock circuit can be saved.

It is to be noted that although a plurality of circuits or subcircuits of a device for action execution have been mentioned in the above detailed description, this partition is not compulsory. Actually, according to the embodiments of the present disclosure, features and functions of two or more circuits or subcircuits as described above may be embodied in one circuit or subcircuit. Reversely, features and functions of one circuit or subcircuit as described above may be further embodied in more circuits or subcircuits.

Other embodiments of the present disclosure will be apparent to those skilled in the art from consideration of the specification and practice of the invention disclosed here. This application is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the claims.

INDUSTRIAL APPLICABILITY

In the embodiments of the present disclosure, by controlling the second subcircuit to be connected in parallel with the first subcircuit to raise a bias voltage outputted, the bias voltage can be flexibly adjusted, such that the power of the load circuit controlled by the bias voltage can be flexibly controlled. By applying the circuit for generating a bias signal into the clock calibration circuit to flexibly adjust the bias signal, the power of the clock calibration circuit can be reduced in a low-speed mode with lower power requirements, thereby reducing overall power of an integrated circuit.

What is claimed is:

1. A circuit for generating a bias signal, comprising:
    a first subcircuit, a first terminal of the first subcircuit being connected to a power supply voltage by means of a first node, a second terminal of the first subcircuit being connected to a current stabilization circuit by means of a second node, the first subcircuit being configured to generate the bias signal and output the bias signal by means of the second node, and the current stabilization circuit being configured to provide a constant current to the second node; and
    a second subcircuit, two terminals of the second subcircuit being respectively connected to the first node and the second node, the second subcircuit comprising a first resistor element and a first switch element connected in series, and the first switch element being controlled to be turned on or off by a low-speed mode control signal;
    wherein the low-speed mode control signal is configured for controlling the first switch element to be turned on to control the second subcircuit to be connected in parallel with the first subcircuit, to raise a bias voltage of the bias signal of the second node;
    wherein the first subcircuit comprises a first transistor and a second transistor, the first transistor and the second transistor being transistors of a same type, a first terminal of the first transistor being connected to the first node, a second terminal of the first transistor being connected to a first terminal of the second transistor, both a control terminal of the first transistor and a second terminal of the second transistor being connected to the second node, and a control terminal of the second transistor being connected to a bias control voltage.

2. The circuit for generating a bias signal according to claim 1, wherein the first resistor element comprises a third transistor and a fourth transistor, the third transistor and the fourth transistor being transistors of the same type, a first terminal of the third transistor being connected to the first node, a second terminal of the third transistor being connected to a first terminal of the fourth transistor, a control terminal of the third transistor being connected to the second node, a second terminal of the fourth transistor being connected to the second node by means of the first switch element, and a control terminal of the fourth transistor being connected to the bias control voltage.

3. The circuit for generating a bias signal according to claim 2, wherein the first transistor, the second transistor, the third transistor and the fourth transistor are all P-type transistors.

4. The circuit for generating a bias signal according to claim 2, wherein the third transistor and the first transistor have an equal conductive channel width-to-length ratio, and the second transistor and the fourth transistor have an equal conductive channel width-to-length ratio.

5. The circuit for generating a bias signal according to claim 1, wherein the current stabilization circuit comprises a fifth transistor and a second resistor element, a first terminal of the fifth transistor being connected to the second node, a second terminal of the fifth transistor being connected to a third node, and two terminals of the second resistor element being connected to the third node and grounded, respectively.

6. The circuit for generating a bias signal according to claim 5, wherein a gate of the fifth transistor is connected to an output terminal of an amplifier, a first input terminal of the amplifier being connected to a bias control voltage.

7. The circuit for generating a bias signal according to claim 6, wherein the third node is connected to a second input terminal of the amplifier.

8. The circuit for generating a bias signal according to claim 5, further comprising:
    a third subcircuit, two terminals of the third subcircuit being connected to the first node and the third node respectively, the third subcircuit being configured to reduce current of the second node.

9. The circuit for generating a bias signal according to claim 8,
    wherein the third subcircuit comprises a third resistor element and a sixth transistor, a first terminal of the sixth transistor being connected to the third resistor element, a second terminal of the sixth transistor being connected to the third node, and a gate of the sixth transistor being connected to a bias control voltage.

10. The circuit for generating a bias signal according to claim 1, wherein the first node is connected to the power supply voltage by means of a second switch element, the second switch element being controlled by a bias voltage to enable a control signal.

11. The circuit for generating a bias signal according to claim 1, wherein the bias signal is configured for controlling a third switch element, the third switch element being a P-type transistor, a first terminal of the third switch element being electrically connected to the power supply voltage, a second terminal of the third switch element being connected to a load circuit, and a control terminal of the third switch element being connected to the second node.

12. The circuit for generating a bias signal according to claim 11, wherein the load circuit is a clock calibration circuit.

13. A clock input circuit, comprising:
    a clock calibration circuit, a first input terminal of the clock calibration circuit being connected to an external input clock, a second input terminal of the clock calibration circuit being connected to a reference clock, the clock calibration circuit being configured to calibrate the external input clock and output a differential clock signal, and the clock calibration circuit being connected to a power supply voltage by means of a third switch element; and
    a circuit for generating a bias signal, wherein the circuit for generating a bias signal is connected to a control terminal of the third switch element, the circuit for generating a bias signal being configured to generate a bias signal, and control degree of opening of the third switch element by means of the bias signal;
    wherein the circuit for generating a bias signal comprises:

a first subcircuit, a first terminal of the first subcircuit being connected to a power supply voltage by means of a first node, a second terminal of the first subcircuit being connected to a current stabilization circuit by means of a second node, the first subcircuit being configured to generate a bias signal and output the bias signal by means of the second node, and the current stabilization circuit being configured to provide a constant current to the second node; and a second subcircuit, two terminals of the second subcircuit being respectively connected to the first node and the second node, the second subcircuit comprising a first resistor element and a first switch element connected in series, and the first switch element being controlled to be turned on or off by a low-speed mode control signal;

wherein the low-speed mode control signal is configured for controlling the first switch element to be turned on to control the second subcircuit to be connected in parallel with the first subcircuit, to raise a bias voltage of the bias signal of the second node.

14. The clock input circuit according to claim 13, wherein the third switch element is a P-type transistor, and the circuit for generating a bias signal is configured to raise a voltage of the bias signal in response to a low-speed mode control signal.

* * * * *